(12) United States Patent
Chiang (10) Patent No.: US 7,940,070 B2
(45) Date of Patent: May 10, 2011

(54) SINGULATED BARE DIE TESTING FIXTURE (75) Inventor: Cheng-Lien Chiang, Taipei (TW)

(73) Assignee: Nichepac Technology Inc., Taipei County (TW)

( * ) Notice: Subject to any disclaimer, the term of this patent is extended or adjusted under 35 U.S.C. 154(b) by 157 days.

(21) Appl. No.: 12/420,585

(22) Filed: Apr. 8, 2009

(65) Prior Publication Data

US 2009/0206857 A1    Aug. 20, 2009

(51) Int. Cl.
*G01R 31/00* (2006.01)

(52) U.S. Cl. .............................. 324/756.02; 234/750.25

(58) Field of Classification Search .................. None
See application file for complete search history.

(56) References Cited

U.S. PATENT DOCUMENTS

| 5,123,850 | A | * | 6/1992 | Elder et al. | 439/67 |
| 5,453,701 | A | * | 9/1995 | Jensen et al. | 324/750.25 |
| 7,419,387 | B2 | * | 9/2008 | Inoue | 439/91 |

* cited by examiner

*Primary Examiner* — Ha Tran T Nguyen
*Assistant Examiner* — Arleen M Vazquez (57) ABSTRACT

A flexible redistribution membrane and a piece of silicon rubber is used in a testing fixture for testing a singulated bare die. The silicon rubber is used as a cushion under the flexible redistribution membrane against the downward pressure from the bare die during testing so that the top pads of the flexible redistribution membrane can be electrically tight coupling to bottom pads of the bared die to be tested.

10 Claims, 10 Drawing Sheets

SINGULATED BARE DIE TESTING FIXTURE

FIELD OF THE INVENTION

This invention relates to a real system testing fixture for testing a singulated bare die through a mother board to which the bare die is going to be mounted.

BACKGROUND

Figure 1:
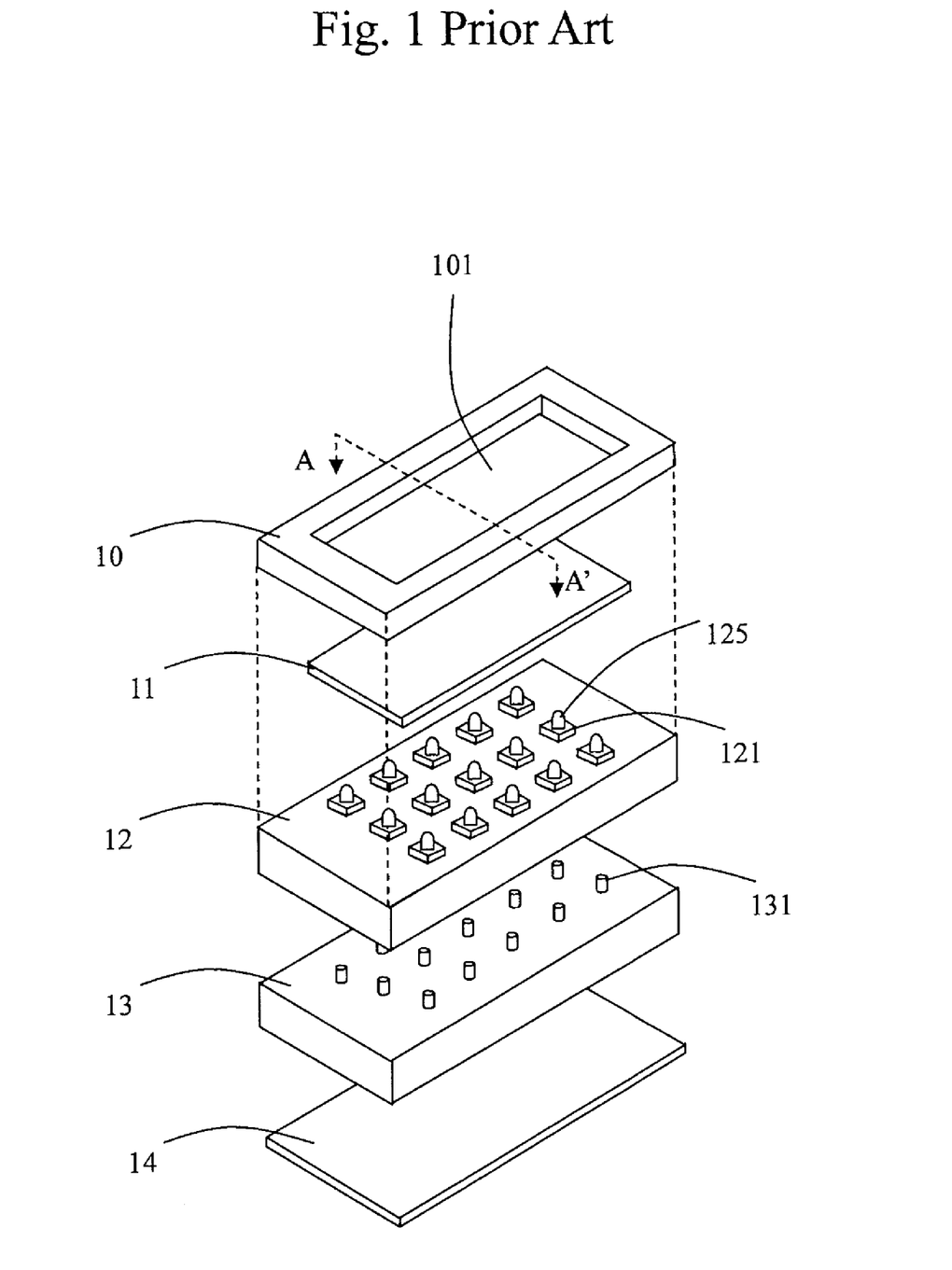
FIG. 1 shows an exploded view of a traditional testing fixture for testing a singulated bare die.

FIG. 1 shows a conventional testing fixture for a singulated bare die

A traditional testing fixture, as seen in FIG. 1, includes an alignment template 10 which has an inner aperture 101 with a contour conforming to an outline of the bare die 11 for aligning the bare die 11 in position so that the bare die 11 can be tested. A die carrier 12 has a plurality of top pads 121 with an arrangement mirrored to an arrangement of a plurality of bottom pads 112 (see FIG. 2) of the bare die 11. An elastomeric probe 125 is made on each of top pads 121 for electrically contact with corresponding one of the bottom pads 112 of the bare die 11. The die carrier 12 has a plurality of bottom pads 122 each being electrically coupling to corresponding one of said top pads 121 of the die carrier 12. An electrical connector 13 has a plurality of elastomeric leads 131 for electrically coupling to the bottom pads 122 (see FIG. 2) of the die carrier 12. A mother board 14 to which the bare die 11 is going to be mounted has a plurality of top pads 141 for electrically coupling to the elastomeric lead 131 of the electrical connector 13. The traditional testing fixture requires preparing a plurality of elastomeric probes 125 each made on corresponding one of the top pads 121 of the die carrier 12. Therefore, a more reliable mechanism is eager to develop for improving the traditional complicate elastomeric probe structure.

Figure 2:
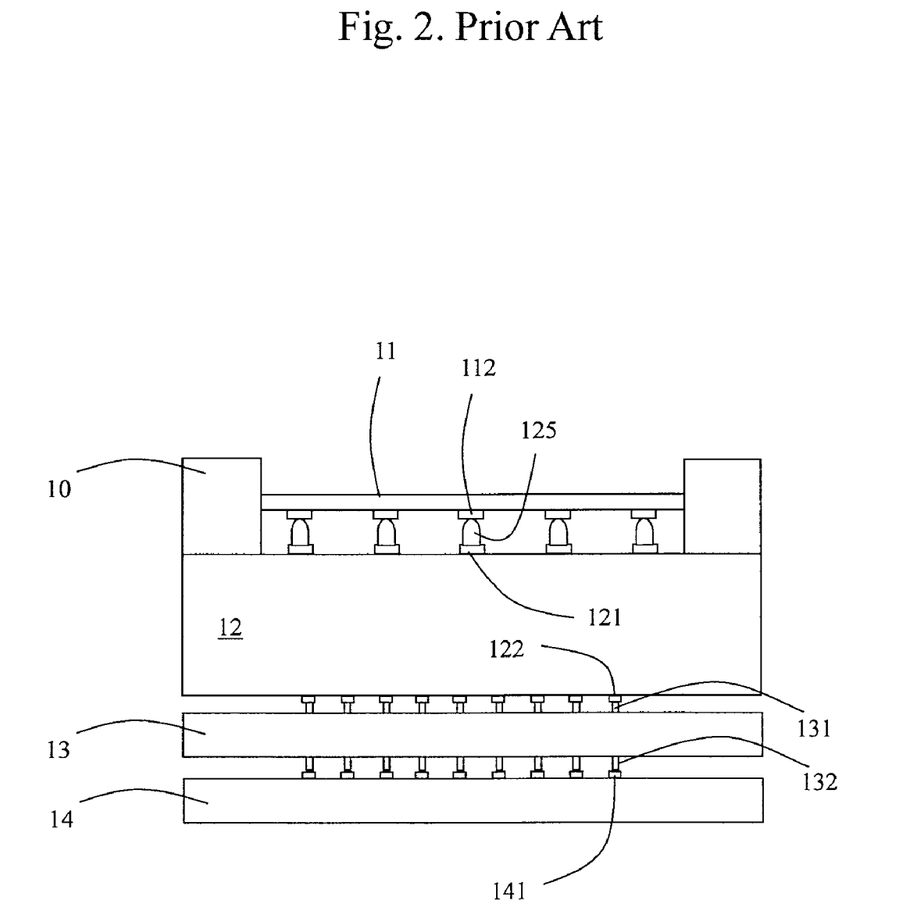
FIG. 2 shows a section view of FIG. 1 along line AA'

FIG. 2 shows a section view of FIG. 1 along line AA'

A bare die 11 is aligned by the aperture 101 of the alignment template 10. The bare die 11 has a plurality of bottom pads 112. A die carrier 12 has a plurality of top pads 121. An elastomeric probe 125 is made on top of each of top pads 121 of the die carrier 12. A plurality of bottom pads 122 is made on the bottom side of the die carrier 12 each being electrically coupling to corresponding one of the top pads 121. An electrical connector 13 has a plurality elastomeric leads having a top end 131 and a bottom end 132. Each of the top ends 131 is electrically coupling to corresponding one of the bottom pads 122 of the die carrier 12. A mother board 14 to which the bare die 11 is going to be mounted has a plurality of top pads 141 for electrically coupling to corresponding one of the bottom ends 132 of the elastomeric lead of the electrical connector 13.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

FIG. 6b shows a section view of a second embodiment of an assembled testing fixture according to the present invention for testing a bare die of FIG. 6a.

FIG. 10b shows a section view of a modified embodiment to test the bare die of FIG. 10a.

DETAILED DESCRIPTION OF EMBODIMENTS

The elastomeric contact mechanism between a bare die to be tested and a testing fixture during testing is simplified as disclosed in the present invention in a way of using a flexible redistribution membrane for electrical coupling to the testing fixture, and using a piece of silicon rubber as a cushion under the membrane against the downward pressure from the bare die during testing.

Figures 3A, 3B, 3C:
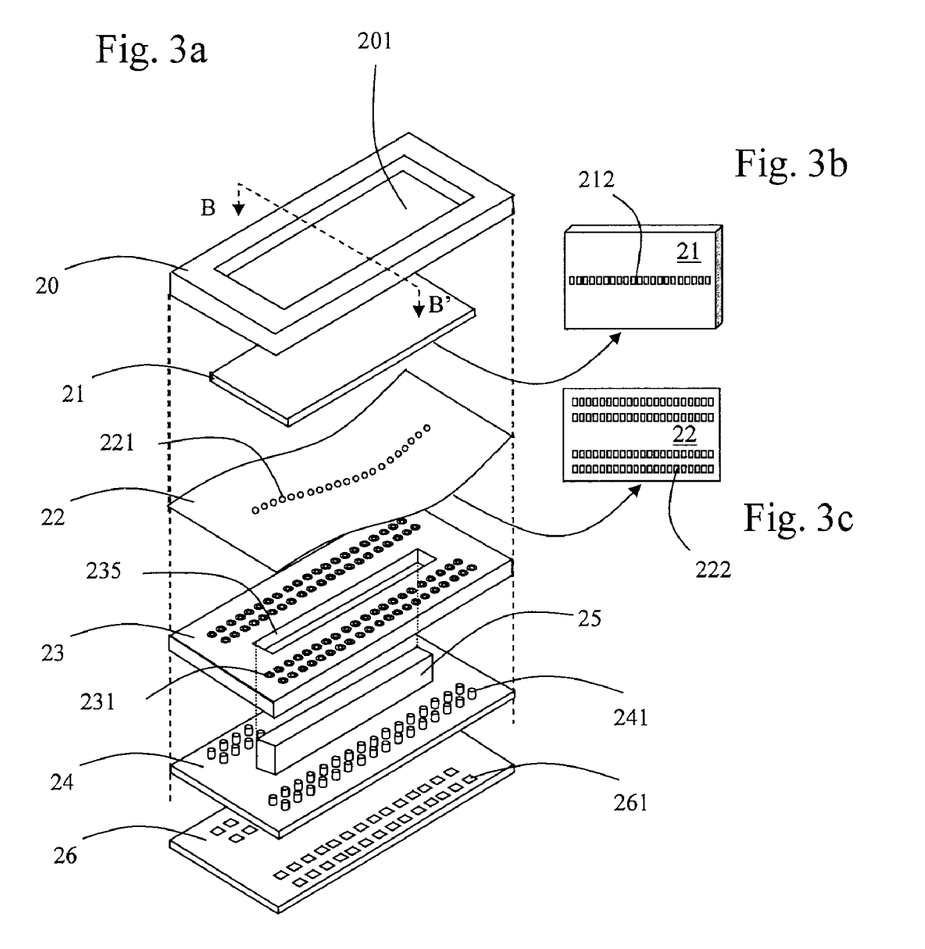
FIG. 3a shows an exploded view of a first embodiment of a testing fixture according to the present invention.
FIG. 3b shows a bottom view of a bare die to be tested according to the present invention.
FIG. 3c shows a bottom view of a flexible redistribution membrane used in a testing fixture according to the present invention.

FIG. 3a shows an exploded view of a first embodiment of a testing fixture according to the present invention.

An improved testing fixture for testing a singulated bare die having a plurality of bottom pads is shown in FIG. 3a. A bare die 21 to be tested has a plurality of bottom pads 212 (see FIG. 3b) on bottom side of the bare die 21. An alignment template 20 has a center aperture 201 with at least partial contour conforming to an outline of the bare die 21 for aligning the bare die 21 in position to test. A flexible redistribution membrane 22 has a plurality of top pads 221 with an arrangement mirrored to an arrangement of the bottom pads 212 of the bare die 21. Each of the plurality of pads 221 is configured for electrically coupling to corresponding one of the bottom pads 212 of the bare die 21 during testing. The flexible redistribution membrane 22 has a plurality of redistributed bottom pads 222 (see FIG. 3c) each being electrically coupling to corresponding one of the top pads 221 of the flexible redistribution membrane 22. The bare die 21 has compact I/O pads on a bottom side with fine pitch in between the bottom pads 212, however a mother board 26 to which the bare die 21 is going to be mounted has corresponding pads with larger pitch, therefore, a flexible redistribution membrane 22 is used. The flexible redistribution membrane 22 has a plurality of top pads 221 mirrored to the plurality of bottom pads 212 of a bare die 21. The flexible redistribution membrane 22 has a plurality of redistributed bottom pads 222 with a larger pitch to facilitate the bare die 21 to electrically coupling for testing over a mother board 26. A membrane holder 23 has a plurality of top pads 231 each being electrically coupling to corresponding one of the bottom pads 222 of the flexible redistribution membrane 22. The membrane holder 23 has a plurality of bottom pads 232 on bottom side; each of the bottom pads 232 is electrically coupling to corresponding one of the pads 231 of the membrane holder 23. A slot 235 is made in the center of the membrane holder 23; the slot 235 is configured under the flexible redistribution membrane 22, and is aligned with the top pads 221 of the flexible redistribution membrane 22. An elastomeric member such as a silicon rubber 25 is configured in the slot 235 with a top surface protruded above a top surface of the membrane holder 23 as a cushion under the flexible redistribution membrane 22 against the downward pressure from the bare die 21 during testing to make the top pads 221 of the flexible redistribution membrane 22 electrically tight contact with the bottom pads 212 of the bare die 21. An electrical connector 24 has a plurality of elastomeric leads which comprises a top end 241 and a bottom end 242; each top end 241 of the elastomeric leads is made electrically coupling to corresponding one of the bottom pads 232 (see FIG. 4) of the membrane holder 23. The mother board 26 has a plurality of top pads 261 each being electrically coupling to corresponding one of the bottom end 242 (see FIG. 4) of the elastomeric leads of the electrical connector 24.

Figure 4:
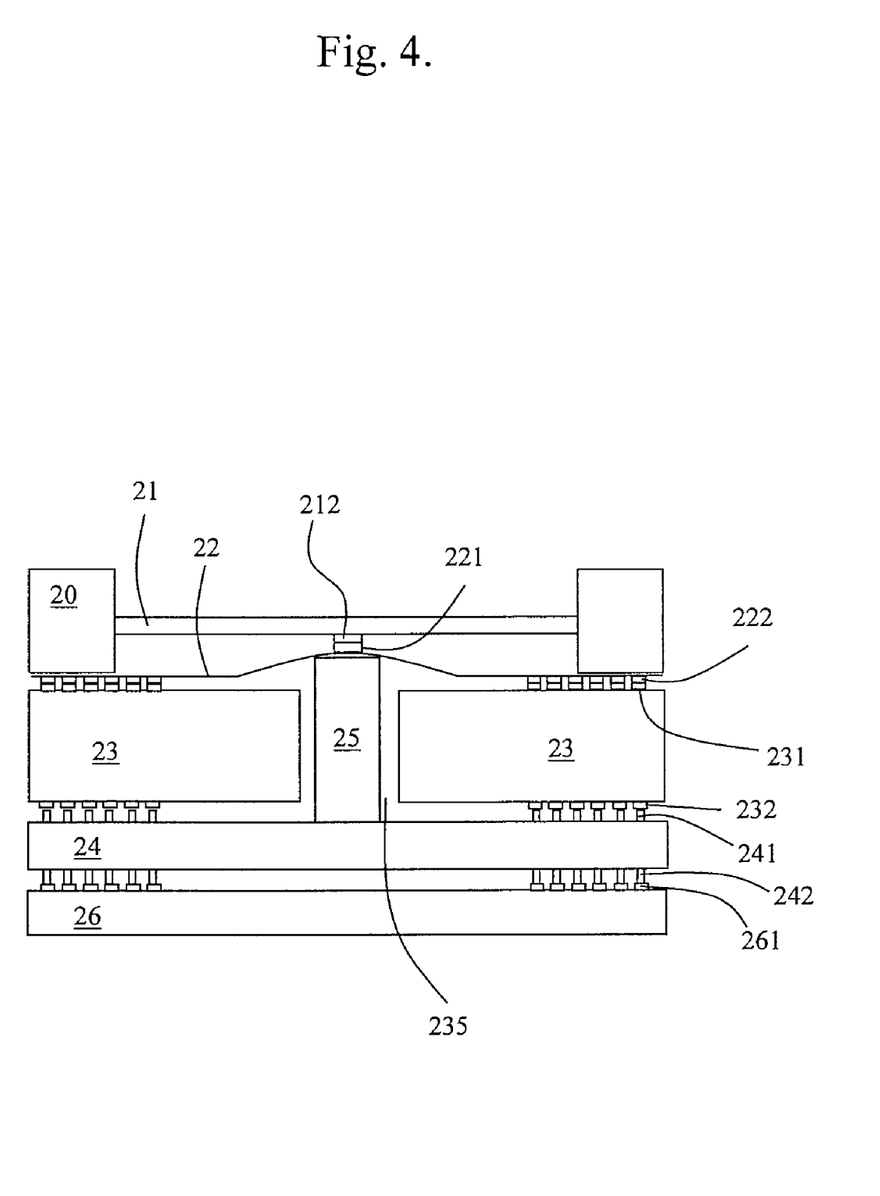
FIG. 4 shows a section view of an assembled fixture of FIG. 3a along line BB'.

FIG. 4 shows a section view of an assembled fixture of FIG. 3a along line BB'

A section view of an assembled testing fixture of FIG. 3a is shown in FIG. 4. An alignment template 20 having an inner aperture 201 with at least partial contour conforming to an outline of a bare die 21 for aligning the bare die 21 in position to test. The bare die 21 has a plurality of bottom pads 212. A flexible redistribution membrane 22 has a plurality of bottom pads 221 with an arrangement mirrored to the arrangement of the bottom pads 212 of the bare die 21. The flexible redistribution membrane 22 has a plurality of redistributed bottom pads 222 each being electrically coupling to corresponding one of the top pads 221 of the flexible redistribution membrane 22. A membrane holder 23 has a plurality of top pads 231 for electrically coupling to corresponding one of the pads 222 of the flexible redistribution membrane 22. The membrane holder 23 has a plurality of bottom pads 232 each electrically coupling to corresponding one of the top pads 231 of the membrane holder 23. A slot 235 is made in the center of the membrane holder 23. An elastomeric member such as a silicon rubber 25 is configured in the slot 235 with a top surface higher than a top surface of the membrane holder 23 as a cushion under the flexible redistribution membrane 22 against the downward pressure from the bare die 21 during testing so that the top pads 221 of the flexible redistribution membrane 22 can be electrically tight contact with the bottom pads 212 of the bare die 21 during testing. An electrical connector 24 has a plurality of elastomeric leads which has a top end 241 and a bottom end 242. Each of the top ends 241 is electrically coupling to corresponding one of the bottom pads 232 of the membrane holder 23. A mother board 26 has a plurality of top pads 261 each being electrically coupling to corresponding one of the bottom end 242 of the elastomeric leads of the electrical connector 24.

Figure 5:
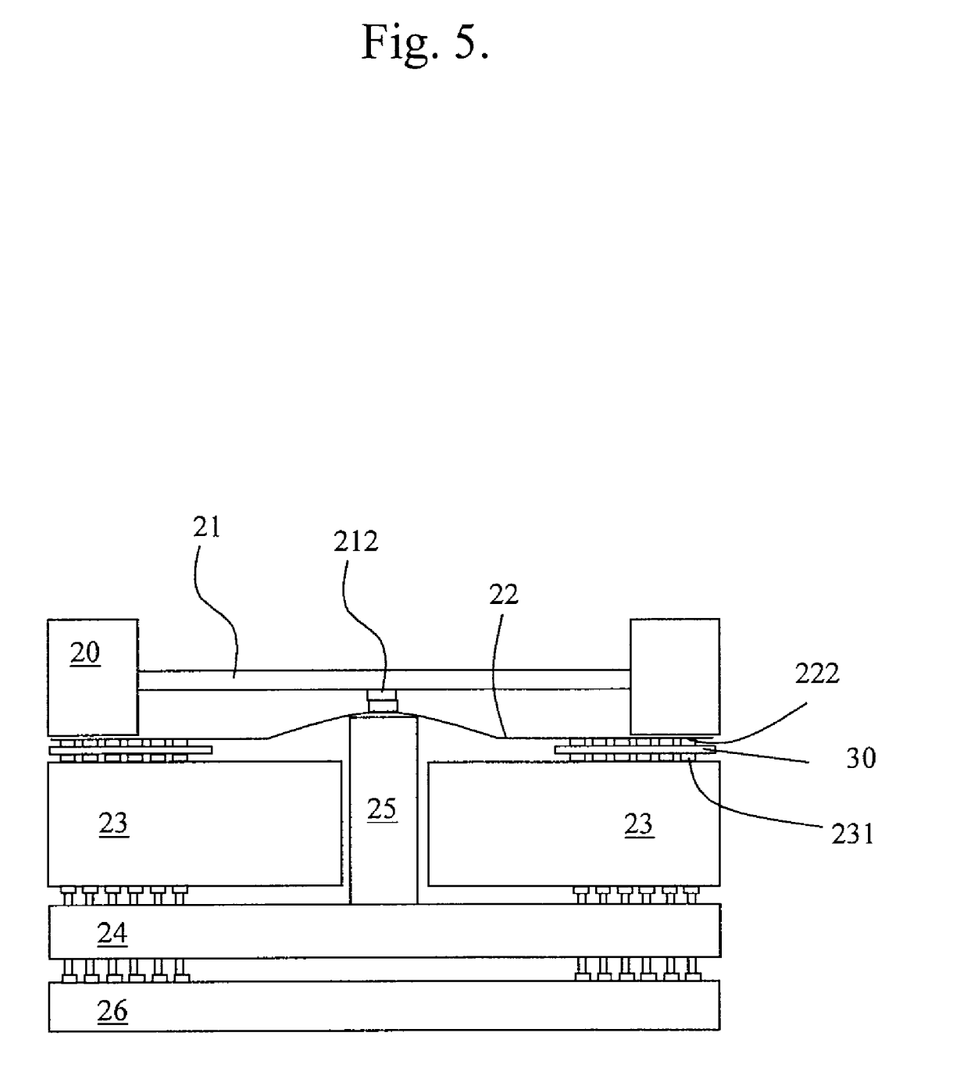
FIG. 5 shows a section view of a modified embodiment to the first embodiment of a testing fixture of FIG. 4.

FIG. 5 shows a section view of a modified embodiment to the first embodiment of a testing fixture of FIG. 4.

An additional layer of anisotropic conductive film (ACF) 30 is inserted in between the bottom pads 222 of the flexible redistribution membrane 22 and the top pads 231 of the membrane holder 23 as shown in FIG. 5. The using of ACF 30 is to assure electrically contact between each of the bottom pads 222 of the flexible redistribution membrane 22 and corresponding one of top pads 231 of the membrane holder 23.

Figure 6A:
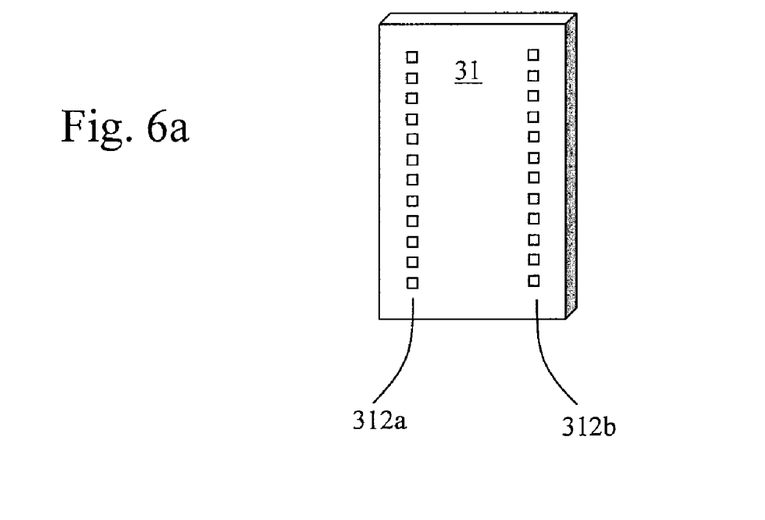
FIG. 6a shows a bare die to be tested which has two pluralities of pads on bottom side.
Figure 6B:
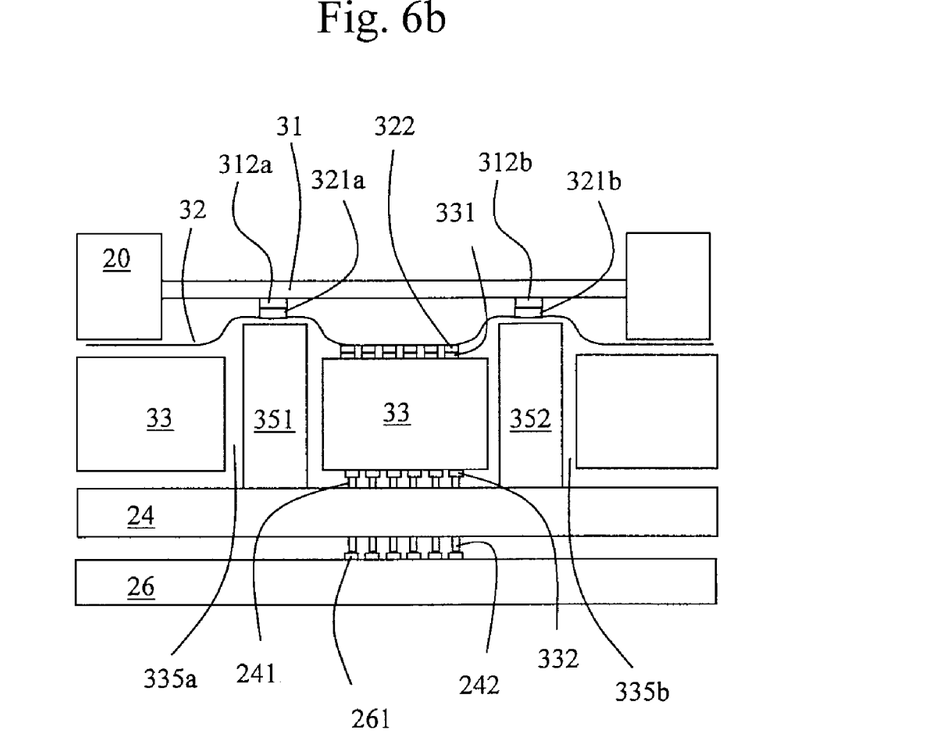

FIG. 6b shows a section view of a second embodiment of an assembled testing fixture according to the present invention for testing a bare die of FIG. 6a.

A testing fixture for testing a singulated bare die 31 which has two pluralities of pads on bottom side is shown in FIG. 6b. A bare die 31 has a plurality of first bottom pads 312a and a plurality of second bottom pads 312b. A flexible redistribution membrane 32 has a plurality of first top pads 321a for electrically coupling to the first bottom pads 312a of the bare die 31 during testing. The redistribution has a plurality of second top pads 321b for electrically coupling to the second bottom pads 312b of the bare die 31 during testing. The flexible redistribution membrane 32 has a plurality of redistributed bottom pads 322 each electrically coupling to corresponding one of the top pads 321a, 321b. A membrane holder 33 has a plurality of top pads 331 each being electrically coupling to corresponding one of the bottom pads 322 of the flexible redistribution membrane 32. The membrane holder 33 has a plurality of bottom pads 332 each being electrically coupling to corresponding one of the top pads 331 of the membrane holder 33. A first slot 335a is made in the membrane holder 33 and is configured under the flexible redistribution membrane 32 and aligned with the first top pads 321a of the flexible redistribution membrane 32. A second slot 335b is made in the membrane holder 33 and is configured under the flexible redistribution membrane 32 and aligned with the second top pads 321b of the flexible redistribution membrane 32. A first rubber 351 is configured in the first slot 335a with a top surface protruded above a top surface of the membrane holder 33 as a cushion under the flexible redistribution membrane 32 against the downward pressure from the bare die 31 during testing to make the first top pads 321a of the flexible redistribution membrane 32 electrically tight contact with the first bottom pads 312a of the bare die 31. A second rubber 352 is configured in the second slot 335b with a top surface protruded above a top surface of the membrane holder 33 as a cushion under the flexible redistribution membrane 32 against the downward pressure from the bare die 31 during testing to make the second top pads 321b of the flexible redistribution membrane 32 electrically tight contact with the second bottom pads 312b of the bare die 31. An electrical connector 24 and a mother board 26 are configured under the membrane holder 33, similar to the embodiment as described in FIG. 4.

Figure 7:
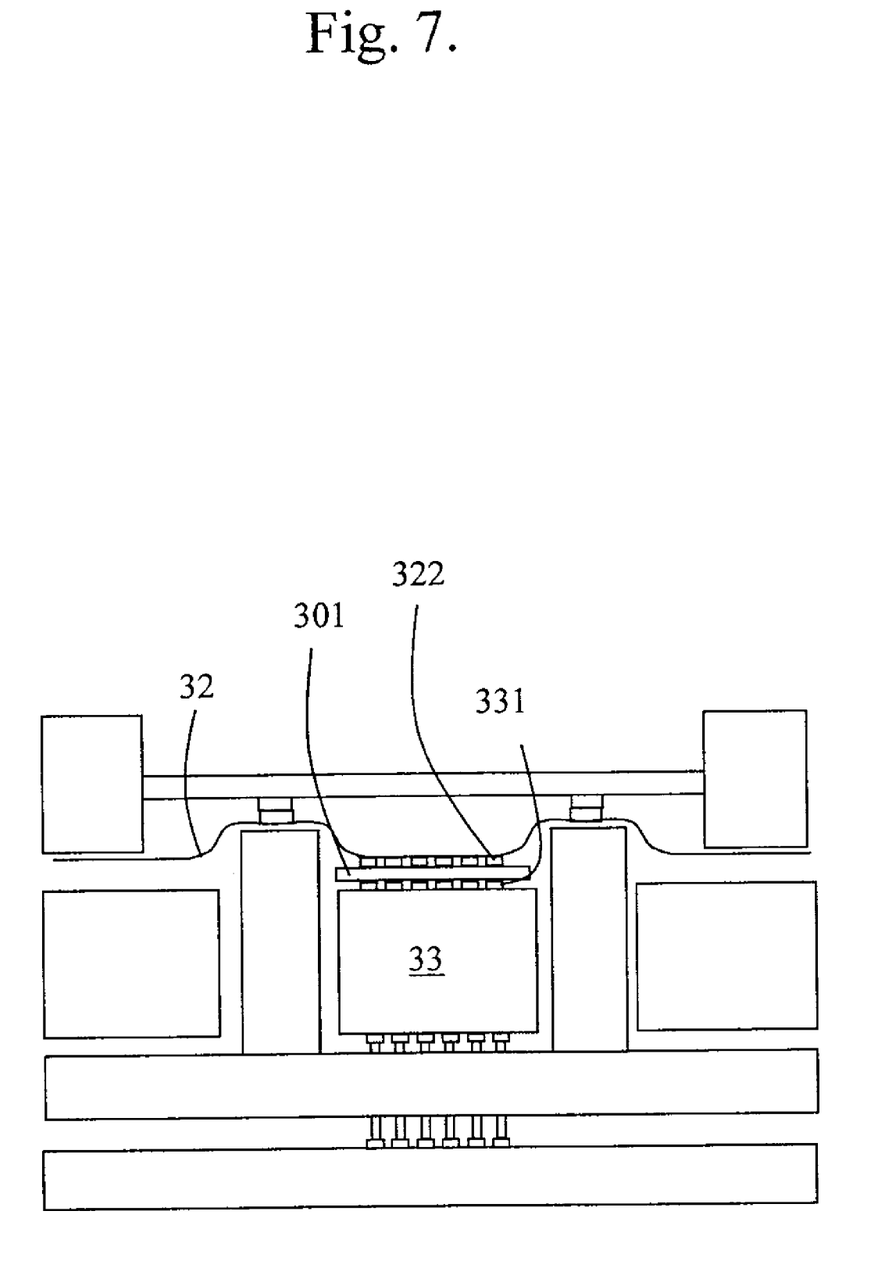
FIG. 7 shows a section view of a modified embodiment to the second embodiment of a testing fixture of FIG. 6b.

FIG. 7 shows a section view of a modified embodiment to the second embodiment of a testing fixture of FIG. 6b.

An additional layer of anisotropic conductive film (ACF) 301 is inserted in between the bottom pads 322 of the flexible redistribution membrane 32 and the top pads 331 of the membrane holder 33 as shown in FIG. 7. The using of ACF 301 is to assure electrically contact between each of the pads 322 of the flexible redistribution membrane 32 and the top pads 331 of the membrane holder 33.

Figure 8:
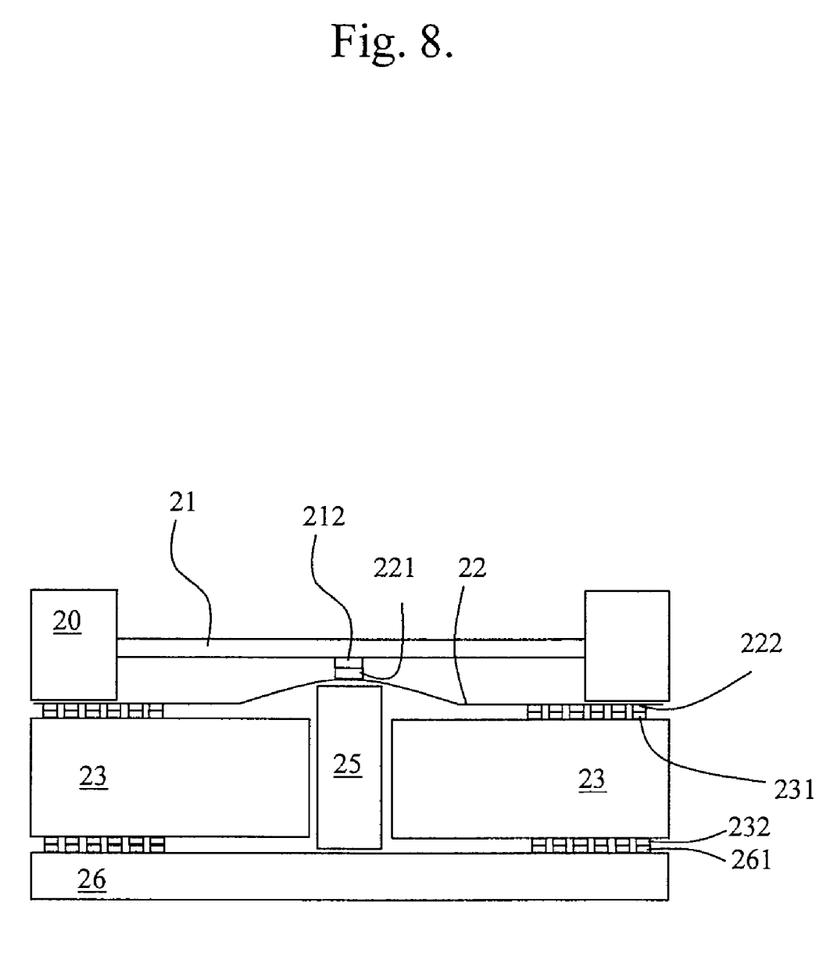
FIG. 8 shows a section view of a modified embodiment to the second embodiment of a testing fixture of FIG. 4.

FIG. 8 shows a section view of a modified embodiment to the second embodiment of a testing fixture of FIG. 4.

The difference between FIG. 8 and FIG. 4 is that FIG. 8 shows a testing fixture without having an electrical connector 24. The bottom pads 232 of membrane holder 23 electrically couple to the top pads 261 of the mother board 26.

Figure 9:
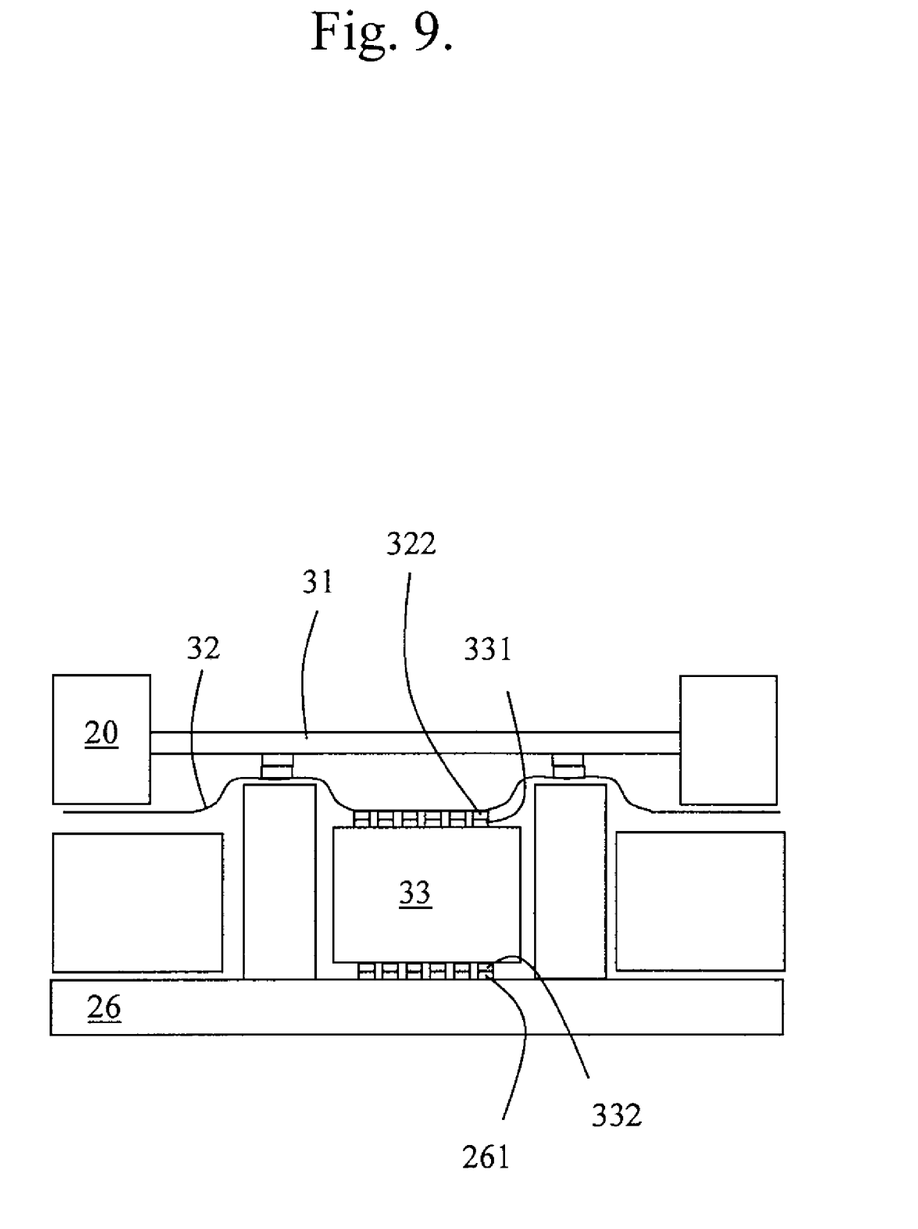
FIG. 9 shows a section view of a modified embodiment to the second embodiment of a testing fixture of FIG. 6b.

FIG. 9 shows a section view of a modified embodiment to the second embodiment of a testing fixture of FIG. 6b.

The difference between FIG. 9 and FIG. 6b is that FIG. 9 shows a testing fixture without having an electrical connector 24. The bottom pads 332 of membrane holder 33 electrically couple to the top pads 261 of the mother board 26.

Figure 10A:
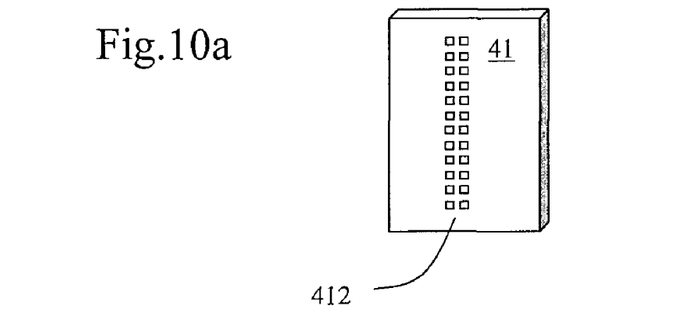
FIG. 10a shows a bare die to be tested which has two rows of pads in the middle

FIG. 10a shows a bare die to be tested which has two rows of pads in the middle bottom FIG. 10a shows a bare die 41 has two rows of pads 412 on the bottom side.

Figure 10B:
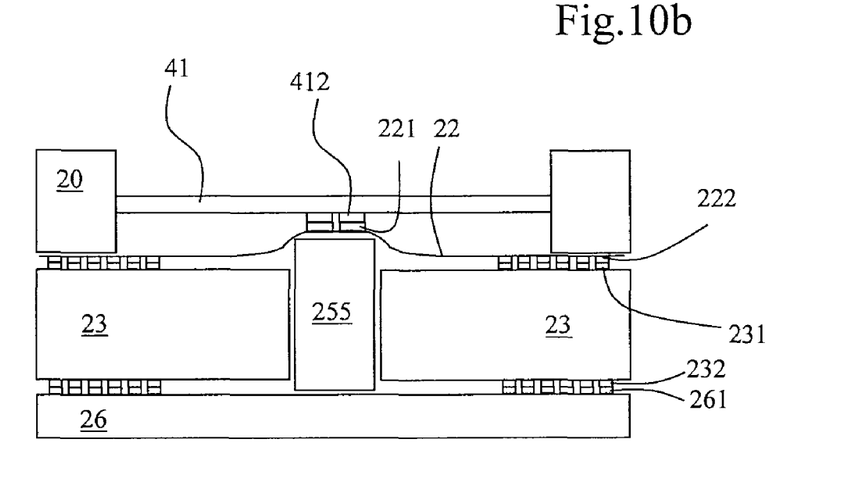

FIG. 10b shows a section view of a modified embodiment to test the bare die of FIG. 10a.

FIG. 10b shows a testing fixture to test the bare die of FIG. 10a. FIG. 10b is similar to FIG. 8 but with a wider silicon rubber 255. A flexible redistribution membrane 22 has top pads 221 mirrored to the pads 412 of the bare die 41 to be tested. During test, the top pads 221 of the flexible redistribution membrane 22 electrically couples to the bottom pads 412 of the die 41.

While several embodiments have been described by way of example, it will be apparent to those skilled in the art that various modifications may be made without departing from the spirit of the present invention. Such modifications are all within the scope of the present invention, as defined by the appended claims.

NUMERICAL SYSTEM 10 alignment template
101 an aperture
11 bare die
112 bottom pad of bare die
12 die carrier
121 top pad of die carrier
122 bottom top pad of die carrier
125 an elastomeric probe
13 an electrical connector
14 mother board
141 top pad of mother board
20 alignment template
201 an aperture
21 bare die
212 bottom pads of bare die
22 a flexible redistribution membrane
221 top pads of flexible redistribution membrane
222 bottom pad of flexible redistribution membrane
23 a membrane holder
235 a slot
231 top pads of membrane holder
232 bottom pads of membrane holder
24 an electrical connector
241 top end of elastomeric lead
242 bottom end of elastomeric lead
25 a rubber
26 a mother board
261 top pads of mother board
30, 301 Anisotropic Conductive Film (ACF)
31 bare die
312a, 312b bottom pads of bare die
32 a flexible redistribution membrane
321a, 321b top pads of flexible redistribution membrane
33 a membrane holder
335a, 335b slot
331 top pads of membrane holder
332 bottom pads of membrane holder
351, 352 rubber
41 bare die
412 bottom pads of bare die

What is claimed is:

1. A singulated bare die testing fixture, comprising:
a flexible redistribution membrane, having a plurality of top pads, and having a plurality of redistributed bottom pads;
a membrane holder, having a plurality of top pads each electrically coupling to corresponding one of said bottom pads of said flexible redistribution membrane; having a plurality of bottom pads;
a slot, being made in said membrane holder, and being aligned with said top pads of said flexible redistribution membrane; and
an elastomeric member, located in said slot, having a top surface protruded above a top surface of said membrane holder as a cushion for said top pads of said flexible redistribution membrane during testing.

2. A testing fixture as claimed in claim 1, further comprising:
an electrical connector, having a plurality of elastomeric leads which further comprising a top end and a bottom end; each said top end of said elastomeric leads being electrically coupling to corresponding one of said bottom pads of said membrane holder.

3. A testing fixture as claimed in claim 2, further comprising:
a mother board, having a plurality of top pads each being electrically coupling to corresponding one of said bottom end of said elastomeric leads.

4. A testing fixture as claimed in claim 1, further comprising:
an anisotropic conductive film, configured in between said bottom pads of said flexible redistribution membrane and said top pads of said membrane holder.

5. A testing fixture as claimed in claim 1, wherein said elastomeric member is a silicon rubber.

6. A singulated bare die testing fixture, comprising:
a flexible redistribution membrane, having a plurality of first top pads, a plurality of second top pads, and having a plurality of redistributed bottom pads;
membrane holder, having a plurality of top pads each electrically coupling to corresponding one of said bottom pads of said flexible redistribution membrane; having a plurality of bottom pads;
a first slot, being made in said membrane holder, aligned with said first top pads of said flexible redistribution membrane;
a second slot, being made in said membrane holder, aligned with said second top pads of said flexible redistribution membrane; and
a first elastomeric member, located in said first slot, having a top surface protruded above a top surface of said membrane holder as a cushion for said first top pads of said flexible redistribution membrane during testing; and
a second elastomeric member, located in said second slot, having a top surface protruded above said top surface of said membrane holder as a cushion for said second top pads of said flexible redistribution membrane during testing.

7. A testing fixture as claimed in claim 6, further comprising:
an electrical connector, having a plurality of elastomeric leads which further comprising a top end and a bottom end; each said top end of said elastomeric leads being electrically coupling to corresponding one of said bottom pads of said membrane holder.

8. A testing fixture as claimed in claim 7, further comprising:
a mother board, having a plurality of top pads each being electrically coupling to corresponding one of said bottom end of said elastomeric leads.

9. A testing fixture as claimed in claim 6, further comprising:
an anisotropic conductive film, being configured in between said bottom pads of said flexible redistribution membrane and said top pads of said membrane holder.

10. A testing fixture as claimed in claim 6, wherein said elastomeric member is a silicon rubber.

* * * * *